(12) United States Patent
Abe et al.

(10) Patent No.: US 8,593,178 B2
(45) Date of Patent: Nov. 26, 2013

(54) CMOS LOGIC CIRCUIT

(75) Inventors: Hiroyuki Abe, Chigasaki (JP); Hironori Nagasawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/423,485

(22) Filed: Mar. 19, 2012

(65) Prior Publication Data

US 2013/0043906 A1   Feb. 21, 2013

(30) Foreign Application Priority Data

Aug. 16, 2011   (JP) .................................. 2011-177860

(51) Int. Cl.
*H01L 25/00* (2006.01)
*H03K 19/00* (2006.01)
*H03K 19/091* (2006.01)

(52) U.S. Cl.
USPC ............................. 326/103; 326/100; 327/566

(58) Field of Classification Search
USPC ............................. 326/100–103; 327/564–566
See application file for complete search history.

(56) References Cited

U.S. PATENT DOCUMENTS

| | | | | |
|---|---|---|---|---|
| 5,151,622 A | * | 9/1992 | Thrower et al. | 326/71 |
| 5,304,867 A | * | 4/1994 | Morris | 326/71 |
| 5,955,893 A | * | 9/1999 | Chang et al. | 326/71 |
| 6,429,683 B1 | * | 8/2002 | Miller et al. | 326/80 |
| 7,336,100 B2 | * | 2/2008 | Correale et al. | 326/68 |
| 7,548,093 B1 | * | 6/2009 | Priel et al. | 326/63 |
| 7,969,191 B2 | * | 6/2011 | Nedalgi | 326/81 |
| 8,350,592 B1 | * | 1/2013 | Malhan et al. | 326/81 |
| 2006/0109031 A1 | * | 5/2006 | Akahori | 326/113 |

FOREIGN PATENT DOCUMENTS

| | | |
|---|---|---|
| JP | 04-175010 A | 6/1992 |
| JP | 05-063543 A | 3/1993 |
| JP | 05-304464 A | 11/1993 |

OTHER PUBLICATIONS

Background Art Information Sheet provided by Applicants, Dec. 13, 2011 (1 page total).

* cited by examiner

*Primary Examiner* — Shawki Ismail
*Assistant Examiner* — Dylan White
(74) *Attorney, Agent, or Firm* — Posz Law Group, PLC

(57) ABSTRACT

A CMOS logic circuit includes a resistive element that is connected to a first voltage line at a first end thereof. The CMOS logic circuit includes a first inverter circuit having a first MOS transistor and a second MOS transistor. The CMOS logic circuit includes a second inverter circuit having a third MOS transistor and a fourth MOS transistor. The CMOS logic circuit includes a fifth MOS transistor that is connected in parallel with the resistive element between the first voltage line and the first end of the first MOS transistor and the gate of which is connected to the second end of the third MOS transistor. The CMOS logic circuit includes a sixth MOS transistor that is connected between the first voltage line and the first output terminal.

20 Claims, 11 Drawing Sheets

100

CMOS LOGIC CIRCUIT

CROSS-REFERENCE TO RELATED APPLICATION

This application is based upon and claims the benefit of priority from the prior Japanese Patent Application No. 2011-177860, filed on Aug. 16, 2011, the entire contents of which are incorporated herein by reference.

FIELD

Embodiments described herein relate generally to a CMOS logic circuit.

BACKGROUND

There are CMOS logic circuits that have a plurality of stages of CMOS inverter circuits formed by a pMOS transistor and an nMOS transistor connected to each other in a complementary manner so as to invert and amplify an input signal, or amplify an input signal without inverting the input signal, and output the amplified signal.

DETAILED DESCRIPTION

A CMOS logic circuit according to an embodiment includes a resistive element that is connected to a first voltage line at a first end thereof and is characterized by an impedance that is nonlinear with an applied voltage. The CMOS logic circuit includes a first inverter circuit having a first MOS transistor of a first conductivity type and a second MOS transistor of a second conductivity type, the first MOS transistor being connected to a second end of the resistive element at a first end thereof, to a first output terminal at a second end thereof and to an input terminal at a gate thereof, and the second MOS transistor being connected to the second end of the first MOS transistor at a first end thereof, to a second voltage line at a second end thereof and to the gate of the first MOS transistor at a gate thereof. The CMOS logic circuit includes a second inverter circuit having a third MOS transistor of the first conductivity type and a fourth MOS transistor of the second conductivity type, the third MOS transistor being connected to the first voltage line at a first end thereof, to a second output terminal at a second end thereof and to the first output terminal at a gate thereof, and the fourth MOS transistor being connected to the second end of the third MOS transistor at a first end thereof, to the second voltage line at a second end thereof and to the gate of the third MOS transistor at a gate thereof. The CMOS logic circuit includes a fifth MOS transistor of the first conductivity type, whose first end and second end are connected in parallel with the resistive element and control terminal is connected to the second end of the third MOS transistor. The CMOS logic circuit includes a sixth MOS transistor of the first conductivity type, whose first end and second end are connected in parallel with the resistive element and control terminal is connected to the second end of the third MOS transistor.

In the following, embodiments will be described with reference to the drawings. In the embodiments described below, it will be assumed that a first voltage line is connected to a positive power supply, a second power supply line is connected to the ground, a MOS transistor of a first conductivity type is a pMOS transistor, and a MOS transistor of a second conductivity type is an nMOS transistor. However, the same description holds true for cases where the polarities of the circuit is reversed, that is, the first voltage line is connected to the ground, the second power supply line is connected to the negative power supply, a MOS transistor of the first conductivity type is a pMOS transistor, and a MOS transistor of the second conductivity type is an nMOS transistor.

First Embodiment

Figure 1:
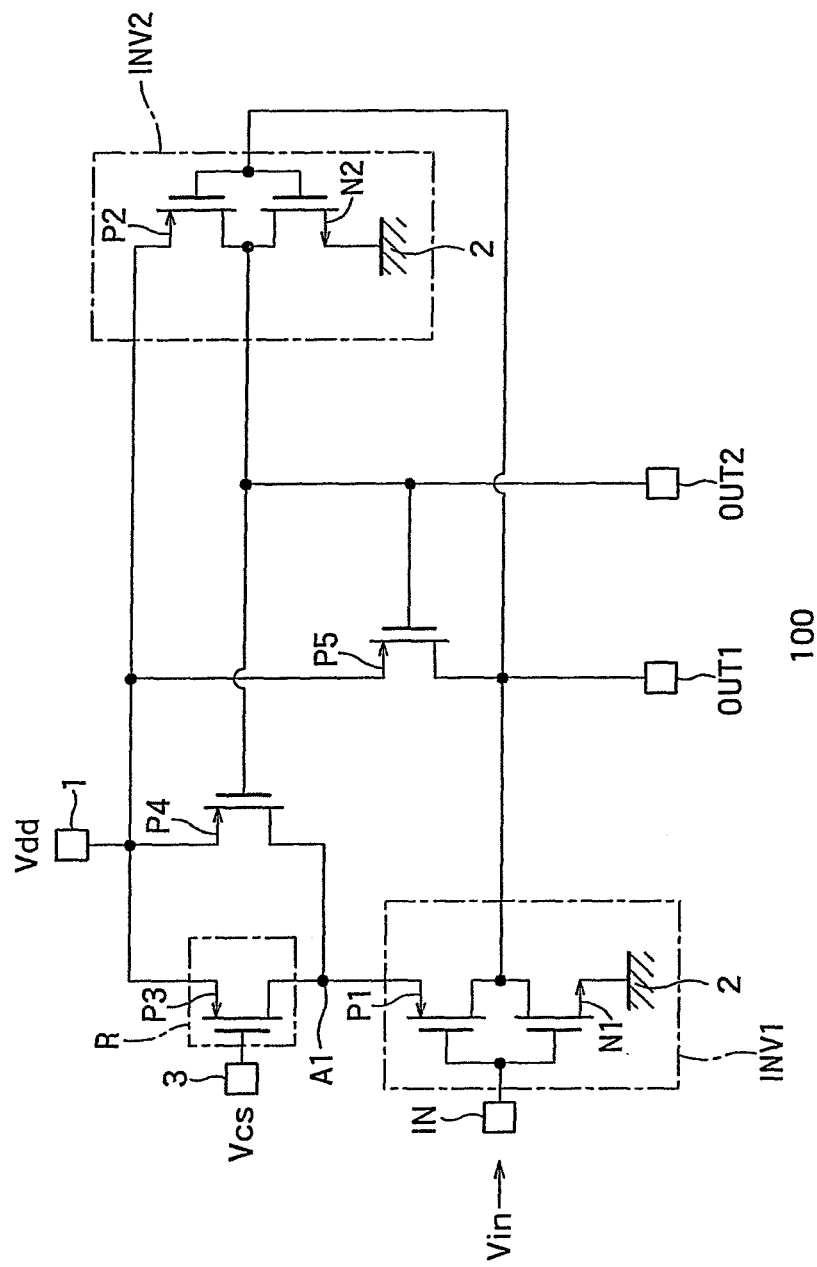
FIG. 1 is a circuit diagram showing an example of a circuit configuration of a CMOS logic circuit 100 according to a first embodiment.

FIG. 1 is a circuit diagram showing an example of a circuit configuration of a CMOS logic circuit 100 according to a first embodiment.

As shown in FIG. 1, the CMOS logic circuit 100 includes a resistive element R, a first MOS transistor of a first conductivity type (pMOS transistor) P1, a second MOS transistor of a second conductivity type (nMOS transistor) N1, a third MOS transistor of the first conductivity type (pMOS transistor) P2, a fourth MOS transistor of the second conductivity type (nMOS transistor) N2, a fifth MOS transistor of the first conductivity type (pMOS transistor) P4 and a sixth MOS transistor of the first conductivity type (pMOS transistor) P5.

As shown in FIG. 1, the resistive element R is connected to a first voltage line (power supply) 1 at one end thereof and to one end (source) of the first MOS transistor P1 at another end thereof. The resistive element R is characterized by an impedance that is nonlinear with an applied voltage.

For example, as shown in FIG. 1, according to the first embodiment, the resistive element R includes a MOS transistor of the first conductivity type (pMOS transistor) P3. The MOS transistor P3 is connected between the first voltage line and one end (source) of the first MOS transistor P1 and connected to a direct-current voltage terminal 3 at the gate thereof. That is, a direct-current voltage "Vcs" is applied to the gate of the MOS transistor P3. The potential difference between the direct-current voltage "Vcs" and a power supply voltage "Vdd" of the first voltage line 1 is constant.

As a result, the MOS transistor P3 is characterized by an impedance that is nonlinear with the applied voltage. In other words, the MOS transistor P3 functions as a current source having a finite impedance.

The first MOS transistor P1 is connected to the another end of the resistive element R at one end (source) thereof, to a first output terminal OUT1 at another end (drain) thereof and to an input terminal IN, to which a control voltage "Vin" is input, at the gate thereof.

The second MOS transistor N1 is connected to the another end (drain) of the first MOS transistor P1 at one end (drain) thereof, to a second voltage line (ground) at another end (source) thereof and to the gate of the first MOS transistor P1 at the gate thereof.

The third MOS transistor P2 is connected to the first voltage line 1 at one end (source) thereof, to a second output terminal OUT2 at another end (drain) thereof and to the first output terminal OUT1 (the another end (drain) of the first MOS transistor P1) at the gate thereof.

The fourth MOS transistor N2 is connected to the another end (drain) of the third MOS transistor P2 at one end (drain) thereof, to the second voltage line 2 at another end (source) thereof and to the gate of the third MOS transistor P2 at the gate thereof.

The fifth MOS transistor P4 is connected in parallel with the resistive element R between the first voltage line 1 and the one end (source) of the first MOS transistor P1, and connected to the another end (drain) of the third MOS transistor P2 at the gate thereof.

The sixth MOS transistor P5 is connected between the first voltage line 1 and the first output terminal OUT1, and connected to the another end (drain) of the third MOS transistor P2 at the gate thereof.

The first MOS transistor P1 and the second MOS transistor N1 form a first inverter circuit INV1 in a first stage. The third MOS transistor P2 and the fourth MOS transistor N2 form a second inverter circuit INV2 in a second stage.

That is, an input of the first inverter circuit INV1 is connected to the input terminal IN, and an output of the first inverter circuit INV1 is connected to the first output terminal OUT1. An input of the second inverter circuit INV2 is connected to the output of the first inverter INV1, and an output of the second inverter circuit INV2 is connected to the second output terminal OUT2.

Next, an operation of the CMOS logic circuit 100 configured as described above will be described.

In the following, the functionality of the CMOS logic circuit will be described for two cases where the control voltage "Vin" input to the input terminal IN is at a low level and where the control voltage "Vin" is at a high level. In the following description, for simplicity, a threshold voltage of the nMOS transistor will be denoted by "Vthn", a threshold voltage of the pMOS transistor will be denoted by "Vthp", and the power supply voltage will be denoted by "Vdd".

(a) Case Where Control Voltage "Vin" is at Low Level

When the control voltage "Vin" changes to a low level, the second MOS transistor N1 is turned off, and the first MOS transistor P1 is turned on. As a result, the voltage potential at the first output terminal OUT1 rises.

Then, when the voltage potential at the first output terminal OUT1 exceeds the threshold voltage "Vthn", the fourth MOS transistor N2 is turned on. As a result, the voltage potential at the second output terminal OUT2 lowers.

Then, when the voltage potential at the second output terminal OUT2 becomes lower than Vdd−|Vthp|, the fifth MOS transistor P4 and the sixth MOS transistor P5 are turned on.

As a result of the turning on of the sixth MOS transistor P5, the voltage potential at the first output terminal OUT1 rises beyond Vdd−|Vthp|, so the third MOS transistor P2 is turned off. As a result, few through-current flows through the second inverter circuit INV2.

In addition, as a result of the turning on of the fifth MOS transistor P4, the impedance looking into the power supply (first voltage line 1) side of a node A1 is derived by the parallel connection of the impedance of the MOS transistor P3 serving as the resistive element and the impedance of the fifth MOS transistor P4. That is, the value of the impedance decreases.

As a result, the voltage potential at the node A1 increases, and the gate-source voltage of the first MOS transistor P1 increases. As a result, the on-resistance of the first MOS transistor P1 decreases, and the voltage potential at the first output terminal OUT1 rises. Thus, the CMOS logic circuit 100 is in a positive feedback state.

However, the on-resistance of the MOS transistor P3 serving as the resistive element R is larger than 0, and the on-resistance of the sixth MOS transistor P5 is also larger than 0. Therefore, the voltage potential at the node A1 and the voltage potential at the first output terminal OUT1 cannot rise to "Vdd" but level off at certain values lower than "Vdd".

(b) Case Where Control Voltage "Vin" is at High Level

When the control voltage "Vin" changes to a high level, the second MOS transistor N1 is turned on. As a result, the potential at the first output terminal OUT1 lowers.

Then, when the voltage potential at the first output terminal OUT1 becomes lower than Vdd−|Vthp|, the third MOS transistor P2 is turned on, and the voltage potential at the second output terminal OUT2 rises.

Then, when the potential at the second output terminal OUT2 becomes higher than Vdd−|Vthp|, the fifth MOS transistor P4 and the sixth MOS transistor P5 are turned off.

As a result of the turning off of the sixth MOS transistor P5, the effect of the sixth MOS transistor P5 on the voltage potential at the first output terminal OUT1 becomes negligible. The voltage potential at the first output terminal OUT1 lowers.

On the other hand, as a result of the turning off of the fifth MOS transistor P4, the impedance looking into the power supply (first voltage line 1) side of the node A1 increases. As a result, the voltage potential at the node A1 lowers, and the first MOS transistor P1 is turned off. As a result, few through-current flows through the first inverter circuit INV1. Then, when the voltage potential at the first output terminal OUT1 becomes lower than "Vthn", the fourth MOS transistor N2 is turned off, and few through-current flows through the second inverter circuit INV2.

As described above, the CMOS logic circuit 100 can suppress the through-currents flowing through the first inverter circuit INV1 and the second inverter circuit INV2.

In particular, when the control voltage "Vin" is at the low level, the impedance looking into the power supply (first voltage line 1) side of the node A1 decreases. This improves the driving capability of the first inverter circuit INV1.

When the control voltage "Vin" is at the high level, the impedance looking into the power supply (first voltage line 1) side of the node A1 increases. Therefore, when the control voltage "Vin" is at the high level, the first MOS transistor P1 can be more readily turned off. In other words, the through-current flowing through the first inverter circuit INV1 can be more effectively suppressed.

In addition, since the fifth and sixth MOS transistors P4 and P5 are pMOS transistors, the fifth and sixth MOS transistors P4 and P5 can be integrated on the same substrate as the first and second inverter circuits INV1 and INV2.

In addition, since the resistive element R is formed by a pMOS transistor, the resistive element R can be integrated on the same substrate as the first and second inverter circuits INV1 and INV2.

In addition, since the MOS transistor P3 serving as the resistive element R functions as a current source having a finite impedance, the impedance of the MOS transistor P3 increases as the applied voltage increases. Therefore, the through-currents flowing through the first and second inverter circuits INV1 and INV2 can be more effectively suppressed.

As described above, the CMOS logic circuit according to the first embodiment can suppress the through-currents and at the same time be improved in driving capability.

Comparative Example

Now, a comparative example against which the embodiments are to be compared will be described. In the following description of the comparative example, for simplicity, the threshold voltage of the nMOS transistor will be denoted by "Vthn", the threshold voltage of the pMOS transistor will be denoted by "Vthp", and the power supply voltage will be denoted by "Vdd".

First, a CMOS logic circuit according to a first comparative example against which the embodiments are to be compared will be described.

Figure 2:
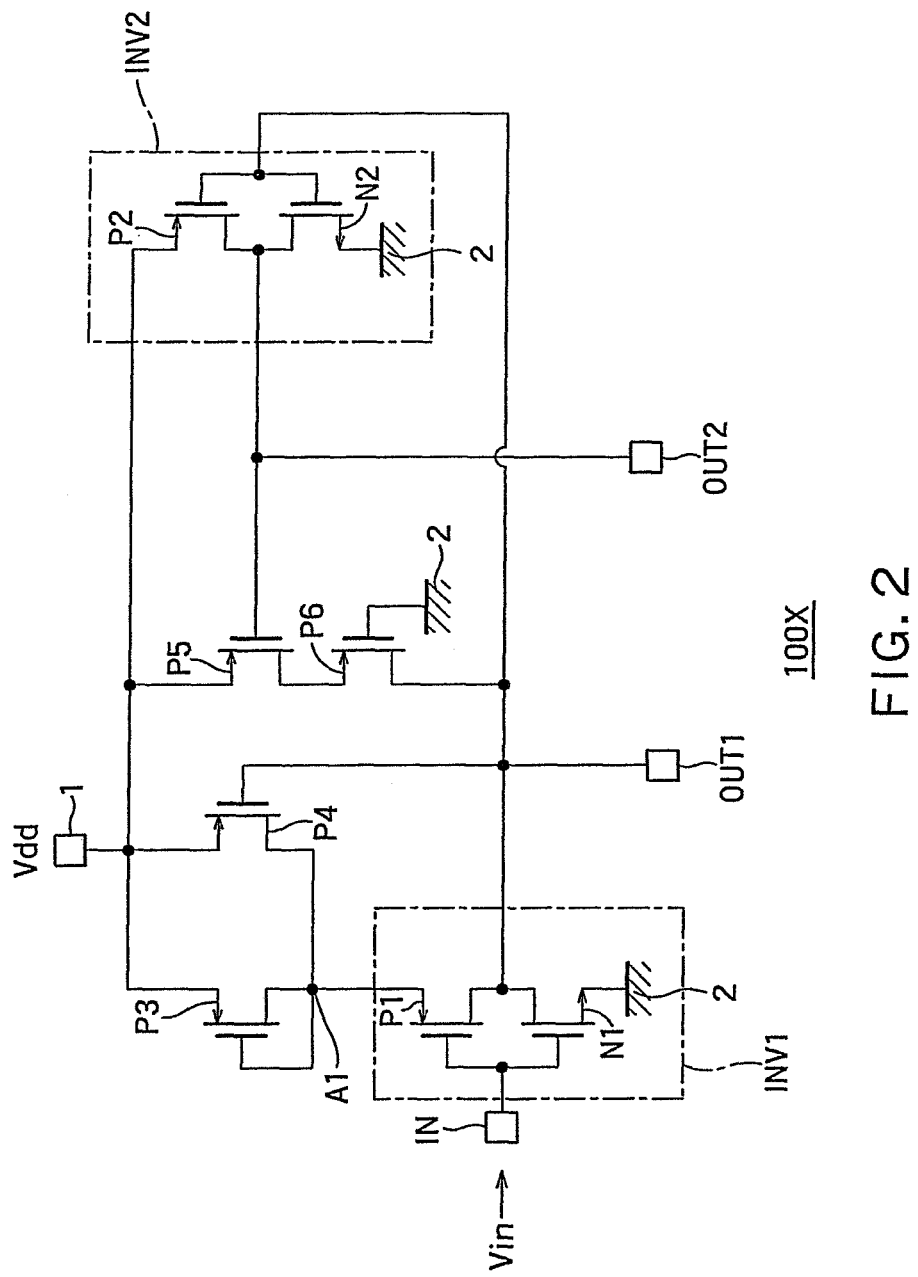
FIG. 2 is a circuit diagram showing a circuit configuration of a CMOS logic circuit 100X according to a first comparative example.

FIG. 2 is a circuit diagram showing a circuit configuration of a CMOS logic circuit 100X according to the first comparative example.

In the CMOS logic circuit 100X shown in FIG. 2, the gate voltage potential of a pMOS transistor P6 is 0V, so the pMOS transistor P6 is always kept in the ON state.

For example, when the control voltage "Vin" changes to the low level, the nMOS transistor N1 is turned off, and the pMOS transistor P1 is turned on, and thus, the voltage potential at the first output terminal OUT1 changes to the high level.

Because of the voltage drop in the pMOS transistor P3, the voltage potential at the first output terminal OUT1 may not rise beyond Vdd−|Vthp|. In this case, the nMOS transistor N2 and the pMOS transistor P2 are turned on together.

However, if the on-resistance of the nMOS transistor N2 is set to be sufficiently smaller than the on-resistance of the pMOS transistor P2, the voltage potential at the second output terminal OUT2 lowers to the voltage at which the pMOS transistor P5 is turned on.

Then, when the pMOS transistor P5 is turned on, the output level of the first inverter circuit INV1 increases beyond Vdd−|Vthp|, and the pMOS transistor P2 is turned off. As a result, the through-current flowing through the second inverter circuit INV2 is suppressed.

In addition, since the voltage potential at the first output terminal OUT1 changes to the high level as described above, the pMOS transistor P4 is turned off. Therefore, the impedance looking into the power supply (first voltage line 1) side of the node A1 is derived by the impedance of the pMOS transistor P3 alone, so the value of the impedance increases. As a result, the driving capability of the first inverter circuit INV1 deteriorates.

On the other hand, when the control voltage "Vin" changes to the high level, the nMOS transistor N1 is turned on.

Therefore, the voltage potential at the first output terminal OUT1 lowers and comes close to the ground voltage, so the nMOS transistor N2 is turned off, and the pMOS transistor P2 is turned on. As a result, the voltage potential at the second output terminal OUT2 rises and comes close to the power supply voltage "Vdd", so the pMOS transistor P5 is turned off, and the effect of the pMOS transistor P5 on the circuit operation becomes negligible.

In addition, since the voltage potential at the first output terminal OUT1 lowers and comes close to the ground voltage as described above, the pMOS transistor P4 is turned on. As a result, the impedance looking into the power supply (first voltage line 1) side of the node A1 is derived by impedance of the parallel connection of the pMOS transistor P3 and the pMOS transistor P4 lowers.

As a result, the source voltage potential of the pMOS transistor P1 of the first inverter circuit INV1 rises, and the pMOS transistor P1 becomes less likely to be turned off.

That is, the through-current flowing through the first inverter circuit INV1 is less effectively suppressed.

As described above, the CMOS logic circuit 100X according to the first comparative example has a problem that the CMOS logic circuit cannot suppress the through-currents and at the same time cannot be improved in driving capability.

Now, for reference purposes, a basic CMOS logic circuit having a plurality of stages of CMOS inverter circuits, which is a premise of the first comparative example, will be described.

Figure 3:
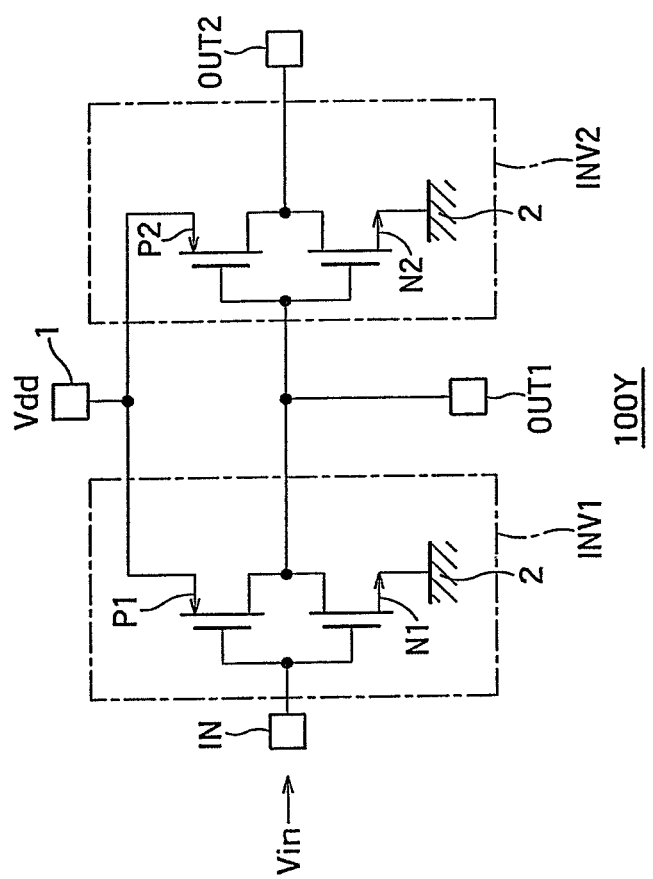
FIG. 3 is a circuit diagram showing an example of a circuit configuration of a basic CMOS logic circuit.

FIG. 3 is a circuit diagram showing an example of a circuit configuration of a basic CMOS logic circuit.

As shown in FIG. 3, a CMOS logic circuit 100Y is a circuit formed by the first inverter circuit INV1 and the second inverter circuit INV2 connected in a two-stage cascade configuration.

The configuration of the CMOS logic circuit 100Y is a basic form of a CMOS input circuit. The control voltage "Vin" is input to the input terminal IN, and a high voltage potential power supply is connected to the first voltage line 1. The control voltage "Vin" is set at one of two values, the low level and the high level.

Now, a case will be described where the control voltage "Vin" meets conditions that the low level is lower than "Vthn", and the high level is higher than Vdd−|Vthp|.

For example, when the control voltage "Vin" is at the low level, the nMOS transistor N1 of the first inverter circuit INV1 is turned off, and the pMOS transistor P1 is turned on. As a result, the voltage potential at the output terminal OUT1 rises and comes close to "Vdd".

On the other hand, when the control voltage "Vin" is at the high level, the nMOS transistor N1 is turned on, and the pMOS transistor P1 is turned off. As a result, the voltage potential at the output terminal OUT1 lowers and comes close to 0V.

In any of the cases described above, few current flows from the first voltage line (power supply) 1 to the second voltage line (ground) 2.

Next, a case will be discussed where the high level of the control voltage "Vin" does not meet the condition described above, that is, is lower than Vdd−|Vthp|. This can be expressed by the following formula (1), where "VinH" represents the control voltage at the high level.

$$VinH < Vdd - |Vthp| \qquad (1)$$

When the relationship expressed by the formula (1) holds, the MOS transistor P1 is not turned off even though the control voltage "Vin" is at the high level. As a result, a through-current flows from the first voltage line (power supply) 1 to the second voltage line (ground) 2 through the two MOS transistors P1 and N1.

Figure 4:
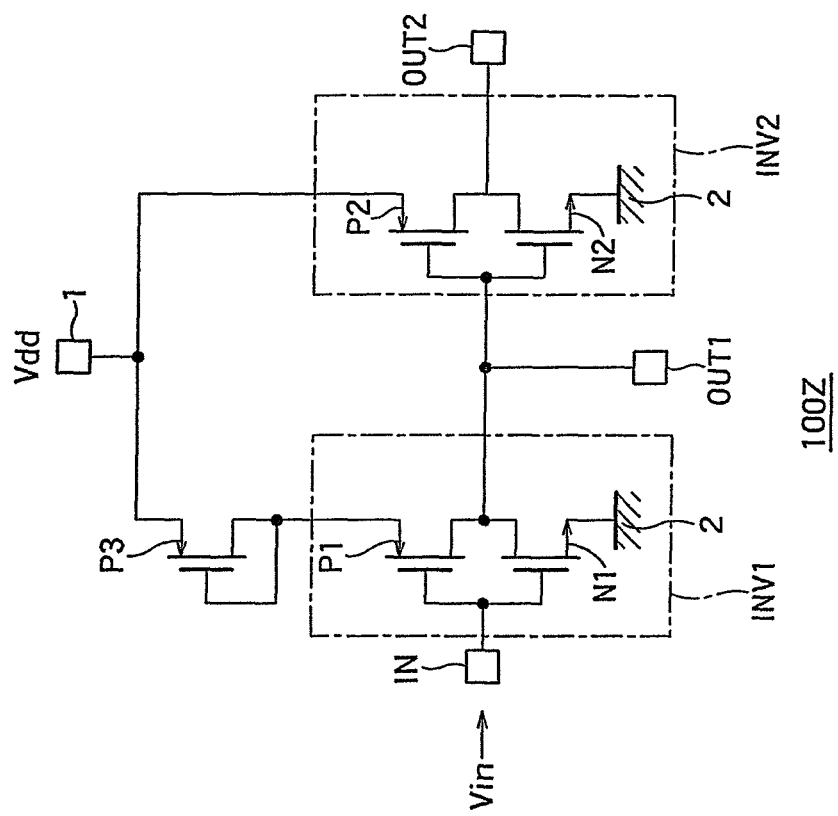
FIG. 4 is a circuit diagram showing a configuration of a CMOS logic circuit that is an improvement of the CMOS logic circuit shown in FIG. 3 that is applied when an input voltage potential is low.

FIG. 4 is a circuit diagram showing a configuration of a CMOS logic circuit that is an improvement of the CMOS logic circuit shown in FIG. 3 that is applied when the high level of the input voltage potential is low.

In a CMOS logic circuit 100Z shown in FIG. 4, a voltage drop occurs in the pMOS transistor P3 forming a diode.

As a result, when the control voltage "Vin" is at the low level, the output of the first inverter circuit INV1 may not rises beyond Vdd−|Vthp|. In this case, the pMOS transistor P2 of the second inverter circuit INV2 in the second stage is not turned off, and the through-current continues flowing through the second inverter circuit INV2.

As described above, even the CMOS logic circuit 100X according to the first comparative example having an improved configuration compared with the basic CMOS logic circuit has the problem that the CMOS logic circuit cannot suppress the through-currents and at the same time cannot be improved in driving capability.

On the other hand, as described above, the CMOS logic circuit according to the first embodiment can suppress the through-currents and at the same time can be improved in driving capability, unlike the CMOS logic circuit according to the first comparative example.

Second Embodiment

In the above first embodiment, a case has been described where the resistive element is a pMOS transistor of which a direct-current voltage is applied to the gate.

In a second embodiment, a case will be described where the resistive element is a depression-type nMOS transistor of which the source and the gate are connected to each other.

Figure 5:
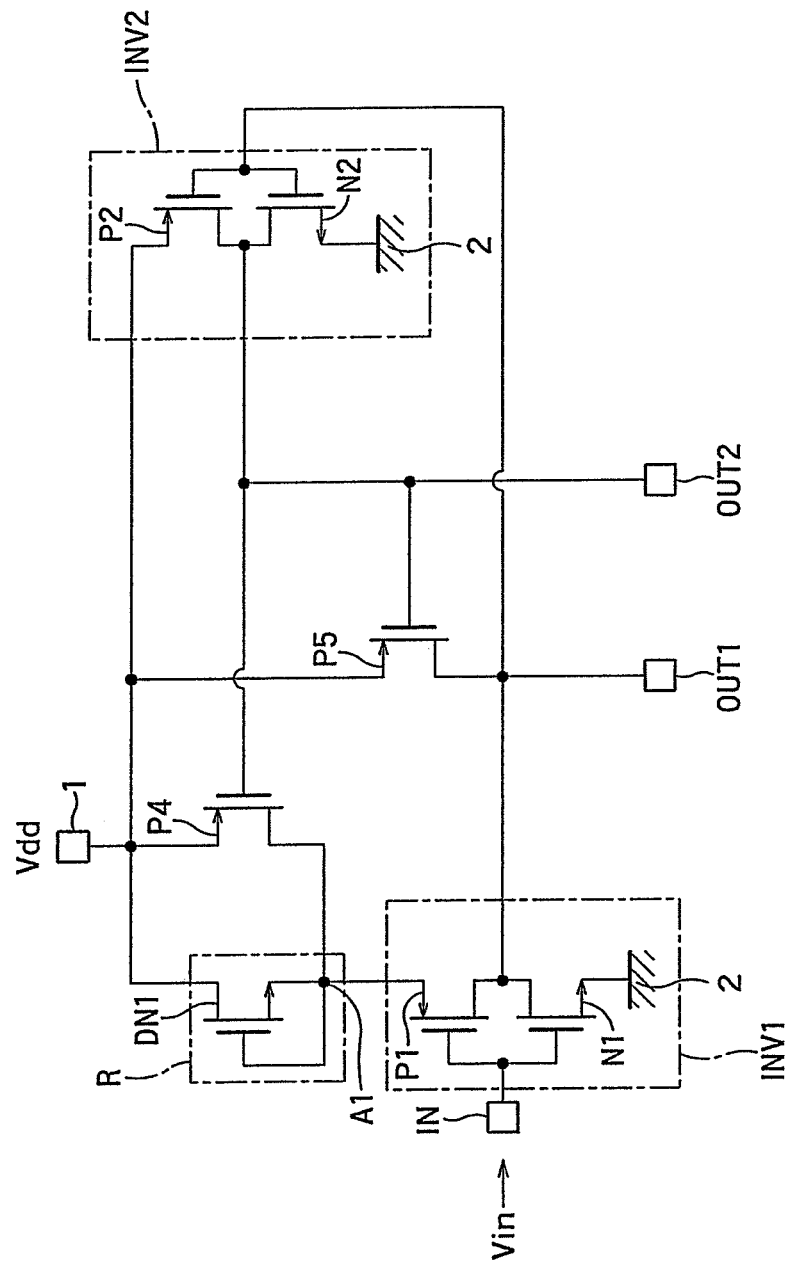
FIG. 5 is a circuit diagram showing an example of a circuit configuration of a CMOS logic circuit 200 according to a second embodiment.

FIG. 5 is a circuit diagram showing an example of a circuit configuration of a CMOS logic circuit 200 according to the second embodiment. In FIG. 5, the same reference numerals as those in FIG. 1 denote the same components as those in the first embodiment.

As shown in FIG. 5, as in the first embodiment, the CMOS logic circuit 200 includes the resistive element R, the first MOS transistor of the first conductivity type (pMOS transistor) P1, the second MOS transistor of the second conductivity type (nMOS transistor) N1, the third MOS transistor of the first conductivity type (pMOS transistor) P2, the fourth MOS transistor of the second conductivity type (nMOS transistor) N2, the fifth MOS transistor of the first conductivity type (pMOS transistor) P4 and the sixth MOS transistor of the first conductivity type (pMOS transistor) P5.

As shown in FIG. 5, according to the second embodiment, the resistive element R represents a depression-type nMOS transistor DN1. The depression-type nMOS transistor DN1 is connected to the first voltage line 1 at one end (drain) thereof and to one end (source) of the first MOS transistor P1 at another end (source) and the gate thereof.

The depression-type nMOS transistor DN1 can be turned on and pass a current and thus can function as a current source even when the source-gate voltage is 0V, so the need for external voltage input is advantageously eliminated.

The remainder of the configuration of the CMOS logic circuit 200 according to the second embodiment is the same as the CMOS logic circuit according to the first embodiment.

The operation of the CMOS logic circuit 200 configured as described above is the same as the operation of the CMOS logic circuit according to the first embodiment.

That is, the CMOS logic circuit according to the second embodiment can suppress the through-currents and at the same time can be improved in driving capability as the CMOS logic circuit according to the first embodiment.

Third Embodiment

In the above second embodiment, a case has been described where the resistive element is a depression-type nMOS transistor of which the source and the gate are connected to each other.

In a third embodiment, a case will be described where the resistive element is a depression-type pMOS transistor of which the source and the gate are connected to each other.

Figure 6:
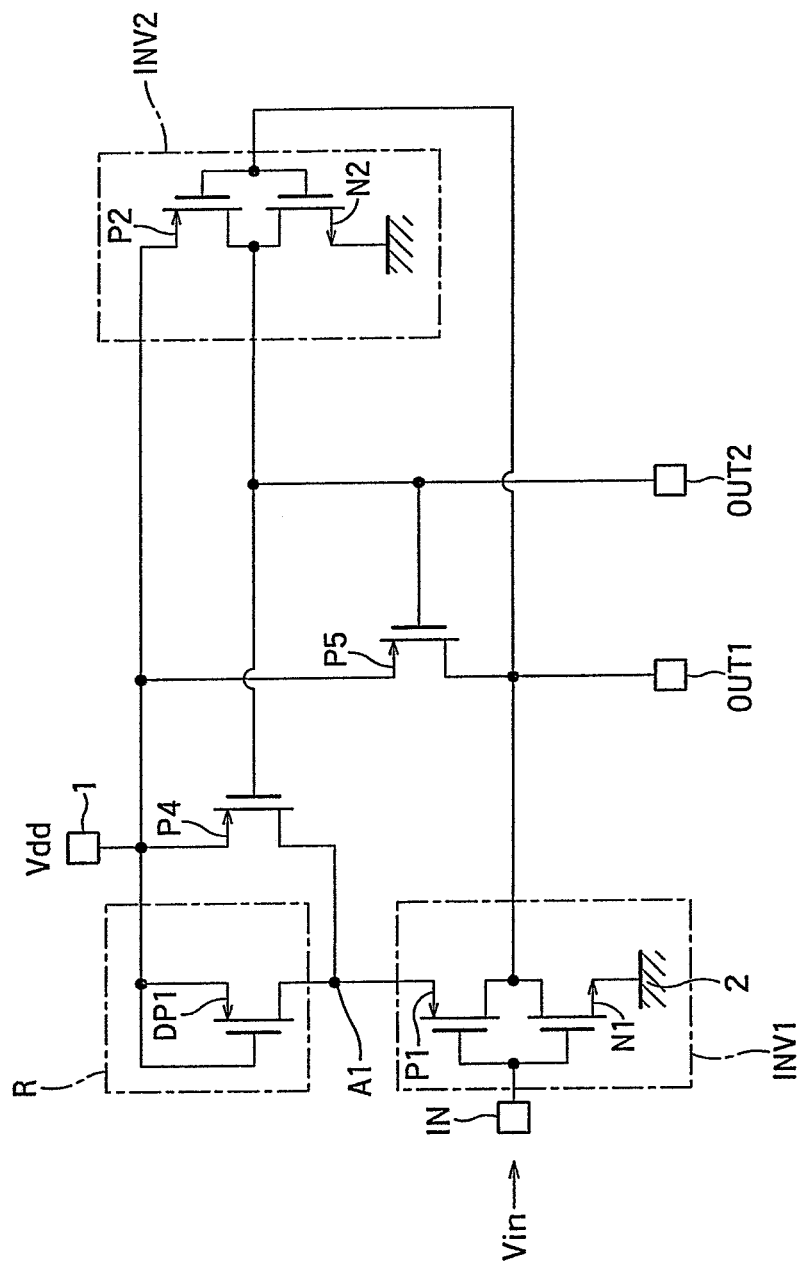
FIG. 6 is a circuit diagram showing an example of a circuit configuration of a CMOS logic circuit 300 according to a third embodiment.

FIG. 6 is a circuit diagram showing an example of a circuit configuration of a CMOS logic circuit 300 according to the third embodiment. In FIG. 6, the same reference numerals as those in FIG. 1 denote the same components as those in the first embodiment.

As shown in FIG. 6, as in the first embodiment, the CMOS logic circuit 300 includes the resistive element R, the first MOS transistor of the first conductivity type (pMOS transistor) P1, the second MOS transistor of the second conductivity type (nMOS transistor) N1, the third MOS transistor of the first conductivity type (pMOS transistor) P2, the fourth MOS transistor of the second conductivity type (nMOS transistor) N2, the fifth MOS transistor of the first conductivity type (pMOS transistor) P4 and the sixth MOS transistor of the first conductivity type (pMOS transistor) P5.

As shown in FIG. 6, according to the third embodiment, the resistive element R includes a depression-type pMOS transistor DP1 of the first conductivity type. The depression-type pMOS transistor DP1 is connected to the first voltage line 1 at one end (source) and the gate thereof and to one end (source) of the first MOS transistor P1 at another end (drain) thereof.

The depression-type pMOS transistor DP1 can be turned on and pass a current and thus can function as a current source even when the source-gate voltage is 0V, so the need for external voltage input is advantageously eliminated.

The remainder of the configuration of the CMOS logic circuit 300 according to the third embodiment is the same as the CMOS logic circuits according to the first and second embodiments.

The operation of the CMOS logic circuit 300 configured as described above is the same as the operations of the CMOS logic circuits according to the first and second embodiments.

That is, the CMOS logic circuit according to the third embodiment can suppress the through-currents and at the same time can be improved in driving capability as the CMOS logic circuits according to the first and second embodiments.

Fourth Embodiment

In a fourth embodiment, a case where the resistive element is a diode will be described.

Figure 7:
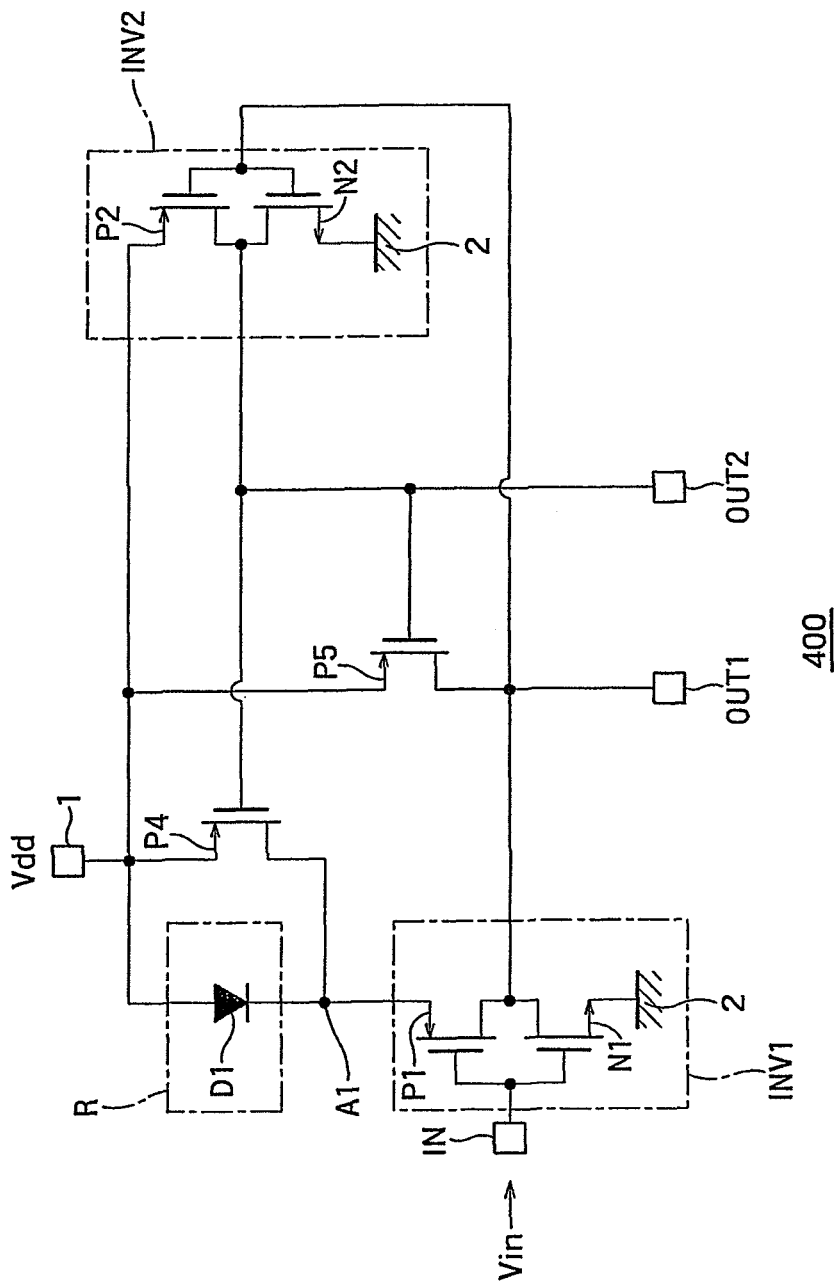
FIG. 7 is a circuit diagram showing an example of a circuit configuration of a CMOS logic circuit 400 according to a fourth embodiment.

FIG. 7 is a circuit diagram showing an example of a circuit configuration of a CMOS logic circuit 400 according to the fourth embodiment. In FIG. 7, the same reference numerals as those in FIG. 1 denote the same components as those in the first embodiment.

As shown in FIG. 7, as in the first embodiment, the CMOS logic circuit 400 includes the resistive element R, the first MOS transistor of the first conductivity type (pMOS transistor) P1, the second MOS transistor of the second conductivity type (nMOS transistor) N1, the third MOS transistor of the first conductivity type (pMOS transistor) P2, the fourth MOS transistor of the second conductivity type (nMOS transistor) N2, the fifth MOS transistor of the first conductivity type (pMOS transistor) P4 and the sixth MOS transistor of the first conductivity type (pMOS transistor) P5.

As shown in FIG. 7, according to the fourth embodiment, the resistive element R represents a diode D1. The diode D1 is connected to the first voltage line 1 at the anode thereof and to one end (source) of the first MOS transistor P1 at the cathode thereof. That is, the diode D1 is forward-biased between the first voltage line 1 and the one end (source) of the first MOS transistor P1.

Although the resistive element R represents one diode D1 in the example shown in FIG. 7, the resistive element R may represent cascaded diodes depending on the difference between the power supply voltage "Vdd" and the high level of the control voltage "Vin".

If the diode D1 is used in the resistive element R, the need for external voltage input is eliminated.

The remainder of the configuration of the CMOS logic circuit 400 according to the fourth embodiment is the same as the CMOS logic circuits according to the first to third embodiments.

Next, differences in characteristics between the resistive element R formed by the current source and the resistive element R formed by the diode will be discussed.

Figure 8:
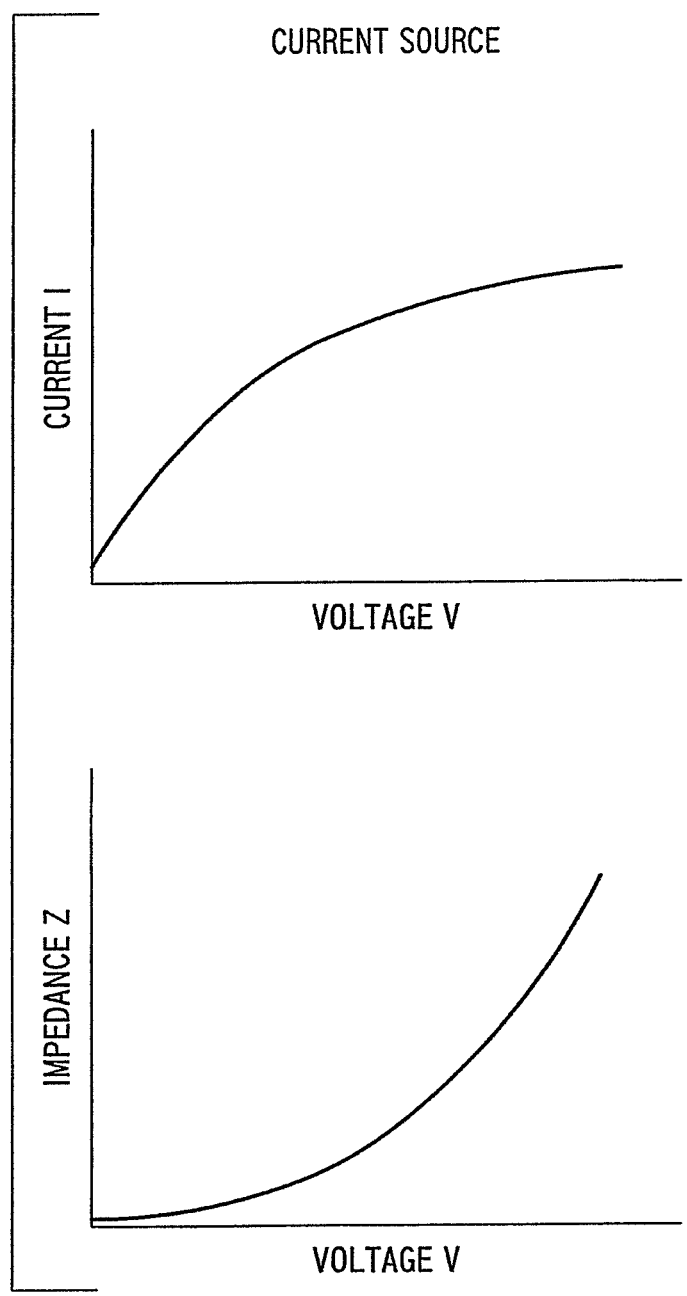
FIG. 8 is graphs showing voltage-current characteristics and voltage-impedance characteristics of a current source.
Figure 9:
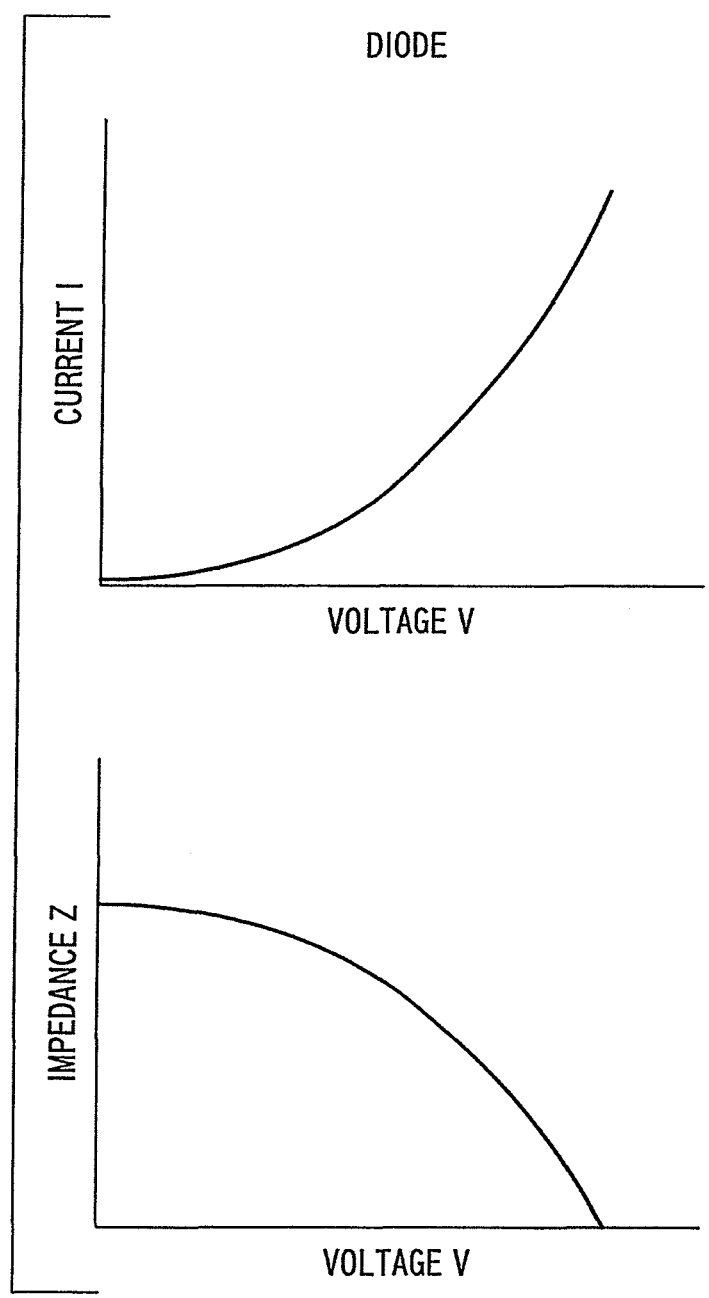
FIG. 9 is graphs showing voltage-current characteristics and voltage-impedance characteristics of a diode.

FIG. 8 includes graphs showing voltage-current characteristics and voltage-impedance characteristics of the current source. FIG. 9 includes graphs showing voltage-current characteristics and voltage-impedance characteristics of the diode.

As shown in FIG. 8, the impedance of the current source depends on the voltage: the impedance of the current source increases as the voltage increases and decreases as the voltage decreases.

However, as shown in FIG. 9, the voltage dependence of the impedance of the diode remarkably differs from the voltage dependence of the impedance of the current source: the impedance of the diode decreases as the voltage increases and increases as the voltage decreases.

As a result, in the CMOS logic circuit 400 according to the fourth embodiment, when the control voltage "Vin" is at the high level, the fifth MOS transistor P4 is in the OFF state, and the impedance looking into the power supply (first voltage line 1) side of the node A1 is derived by the diode D1 alone. In this case, if the voltage potential at the node A1 starts to lower, the voltage on the diode D1 increases, and as a result, the impedance deceases. That is, the CMOS logic circuit 400 is in a negative feedback state, so the voltage potential drop at the node A1 is small, and the first transistor P1 is less likely to be turned off. To avoid this, the number of diodes D1 has to be appropriately increased.

Except for the differences in characteristics resulting from the use of the diode, the operation of the CMOS logic circuit 400 is the same as the operations of the CMOS logic circuits according to the first to third embodiments.

That is, the CMOS logic circuit according to the fourth embodiment can suppress the through-currents and at the same time can be improved in driving capability.

Fifth Embodiment

In the above fourth embodiment, a case where the resistive element is a diode has been described.

In a fifth embodiment, a case where the diode is formed by a pMOS transistor will be described.

Figure 10:
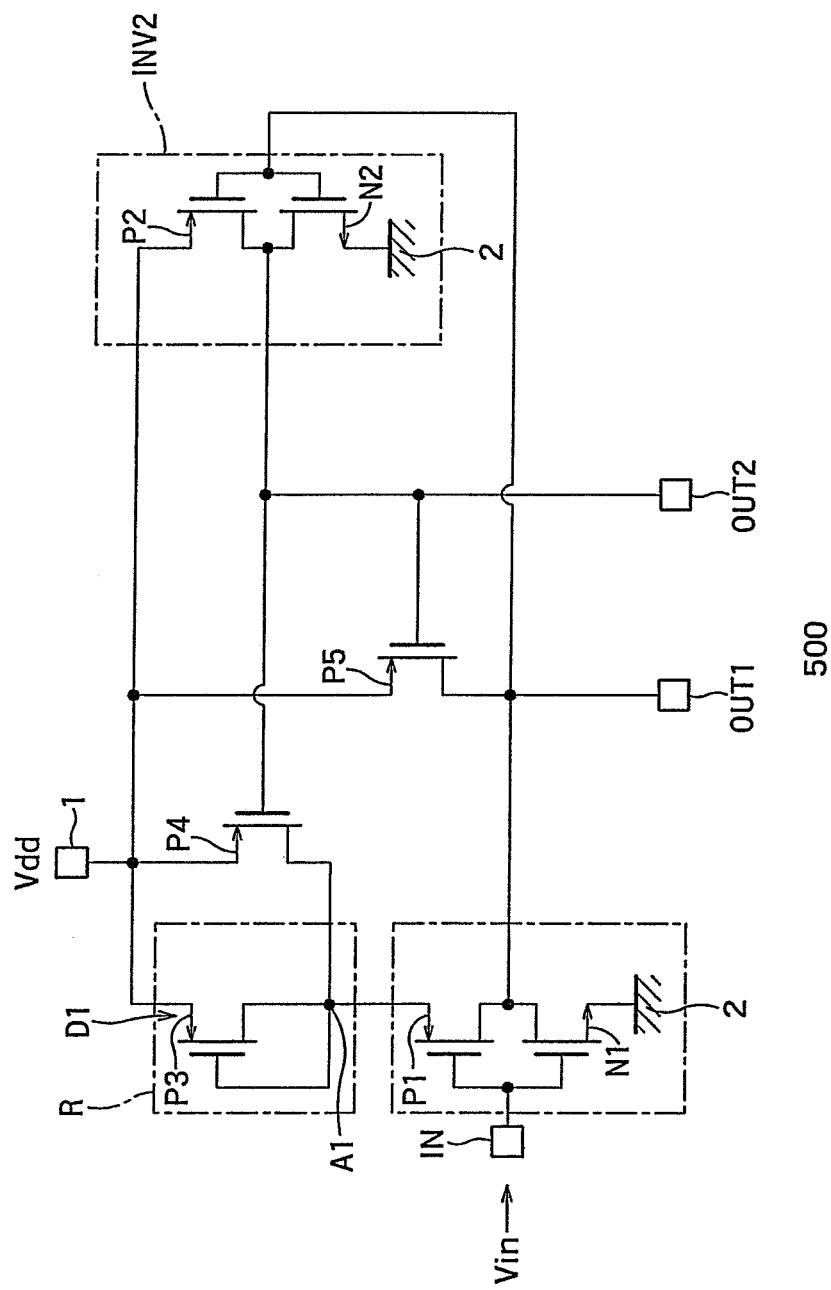
FIG. 10 is a circuit diagram showing an example of a circuit configuration of a CMOS logic circuit 500 according to a fifth embodiment.

FIG. 10 is a circuit diagram showing an example of a circuit configuration of a CMOS logic circuit 500 according to the fifth embodiment. In FIG. 10, the same reference numerals as those in FIG. 9 denote the same components as those in the fourth embodiment.

As shown in FIG. 10, as in the fourth embodiment, the CMOS logic circuit 500 includes the resistive element R, the first MOS transistor of the first conductivity type (pMOS transistor) P1, the second MOS transistor of the second conductivity type (nMOS transistor) N1, the third MOS transistor of the first conductivity type (pMOS transistor) P2, the fourth MOS transistor of the second conductivity type (nMOS transistor) N2, the fifth MOS transistor of the first conductivity type (pMOS transistor) P4 and the sixth MOS transistor of the first conductivity type (pMOS transistor) P5.

As shown in FIG. 10, the resistive element R represents a diode D1. The diode D1 is a pMOS transistor P3 that is connected between the first voltage line 1 and one end (source) of the first MOS transistor P1 and is connected in a diode configuration (the gate and the drain thereof are connected to each other).

As shown in FIG. 10, according to the fifth embodiment, the resistive element R may represents cascaded diodes. The number of the diodes depends on the difference between the power supply voltage "Vdd" and the high level of the control voltage "Vin".

The remainder of the configuration of the CMOS logic circuit 500 according to the fifth embodiment is the same as the CMOS logic circuit according to the fourth embodiment.

The operation of the CMOS logic circuit 500 configured as described above is the same as the operation of the CMOS logic circuit according to the fourth embodiment.

That is, the CMOS logic circuit according to the fifth embodiment can suppress the through-currents and at the same time be improved in driving capability as the CMOS logic circuit according to the fourth embodiment.

Sixth Embodiment

In the above fifth embodiment, an example in which the diode is formed by a pMOS transistor has been described.

In a sixth embodiment, an example in which the diode is formed by an nMOS transistor will be described.

Figure 11:
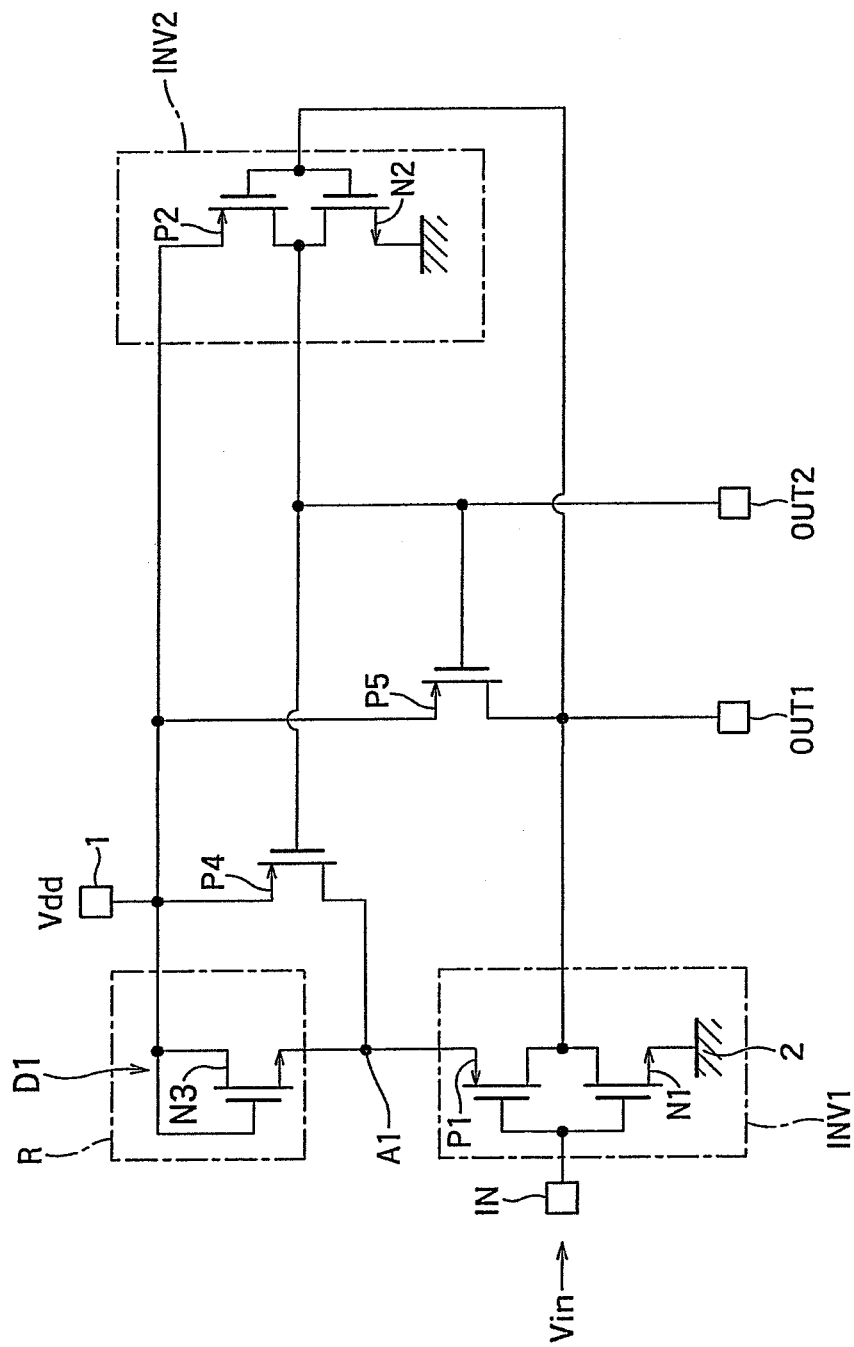
FIG. 11 is a circuit diagram showing an example of a circuit configuration of a CMOS logic circuit 600 according to a sixth embodiment.

FIG. 11 is a circuit diagram showing an example of a circuit configuration of a CMOS logic circuit 600 according to the sixth embodiment. In FIG. 11, the same reference numerals as those in FIG. 9 denote the same components as those in the fourth embodiment.

As shown in FIG. 11, as in the fourth embodiment, the CMOS logic circuit 600 includes the resistive element R, the first MOS transistor of the first conductivity type (pMOS transistor) P1, the second MOS transistor of the second conductivity type (nMOS transistor) N1, the third MOS transistor of the first conductivity type (pMOS transistor) P2, the fourth MOS transistor of the second conductivity type (nMOS transistor) N2, the fifth MOS transistor of the first conductivity type (pMOS transistor) P4 and the sixth MOS transistor of the first conductivity type (pMOS transistor) P5.

As shown in FIG. 11, according to the sixth embodiment, the resistive element R represents a diode D1. The diode D1 is an nMOS transistor N3 that is connected between the first voltage line 1 and one end (source) of the first MOS transistor P1 and is connected in a diode configuration (the gate and the drain thereof are connected to each other).

As shown in FIG. 11, the resistive element R may represents cascaded diodes. The number of the diodes depends on the difference between the power supply voltage "Vdd" and the high level of the control voltage "Vin".

The remainder of the configuration of the CMOS logic circuit 600 according to the sixth embodiment is the same as the CMOS logic circuit according to the fourth embodiment.

The operation of the CMOS logic circuit 600 configured as described above is the same as the operation of the CMOS logic circuit according to the fourth embodiment.

That is, the CMOS logic circuit according to the sixth embodiment can suppress the through-currents and at the same time be improved in driving capability as with the CMOS logic circuit according to the fourth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A CMOS logic circuit, comprising:
a resistive element connected to a first voltage line at a first end thereof and is characterized by an impedance being nonlinear with an applied voltage;
a first inverter circuit having a first MOS transistor of a first conductivity type and a second MOS transistor of a second conductivity type, the first MOS transistor being connected to a second end of the resistive element at a first end thereof, to a first output terminal at a second end thereof, and to an input terminal at a gate thereof, and the second MOS transistor being connected to the second end of the first MOS transistor at a first end thereof, to a second voltage line at a second end thereof, and to the gate of the first MOS transistor at a gate thereof;
a second inverter circuit having a third MOS transistor of the first conductivity type and a fourth MOS transistor of the second conductivity type, the third MOS transistor being connected to the first voltage line at a first end thereof, to a second output terminal at a second end thereof, and to the first output terminal at a gate thereof, and the fourth MOS transistor being connected to the second end of the third MOS transistor at a first end thereof, to the second voltage line at a second end thereof, and to the gate of the third MOS transistor at a gate thereof;
a fifth MOS transistor of the first conductivity type, which is connected in parallel with the resistive element and a control terminal is connected to the second end of the third MOS transistor; and
a sixth MOS transistor of the first conductivity type, which is connected in parallel with the resistive element and a control terminal is connected to the second end of the third MOS transistor,
wherein, when the fifth MOS transistor is turned off, the first MOS transistor is configured to be turned off and a voltage potential at the first output terminal lowers, and the fourth MOS transistor is configured to be turned off by lowering the voltage potential at the first output terminal.

2. The CMOS logic circuit according to claim 1, wherein the first voltage line is connected to a positive power supply, the second voltage line is connected to a ground, the first, third, fifth and sixth MOS transistors of the first conductivity type are pMOS transistors, and the second and fourth MOS transistors of the second conductivity type are nMOS transistors.

3. The CMOS logic circuit according to claim 2, wherein the resistive element comprises a MOS transistor of the first conductivity type, whose first end is connected to the first voltage line, whose second end is connected to the first end of the first MOS transistor, whose gate is applied to a direct-current voltage, and
the voltage potential difference between the direct-current voltage and the voltage of the first voltage line is constant.

4. The CMOS logic circuit according to claim 3, wherein the MOS transistor of the first conductivity type included in the resistive element is a pMOS transistor.

5. The CMOS logic circuit according to claim 2, wherein the resistive element comprises a depression-type MOS transistor of the second conductivity type that is connected to the first voltage line at a first end thereof and is connected to the first end of the first MOS transistor at a second end and a gate thereof.

6. The CMOS logic circuit according to claim 5, wherein the depression-type MOS transistor of the second conductivity type included in the resistive element is a depression-type nMOS transistor.

7. The CMOS logic circuit according to claim 2, wherein the resistive element comprises a depression-type MOS transistor of the first conductivity type that is connected to the first voltage line at a first end and a gate thereof and is connected to the first end of the first MOS transistor at a second end thereof.

8. The CMOS logic circuit according to claim 7, wherein the depression-type MOS transistor of the first conductivity type included in the resistive element is a depression-type pMOS transistor.

9. The CMOS logic circuit according to claim 2, wherein the resistive element comprises a diode that is forward-biased between the first voltage line and the first end of the first MOS transistor.

10. The CMOS logic circuit according to claim 9, wherein the diode is a MOS transistor whose drain and gate are shorted.

11. The CMOS logic circuit according to claim 1, wherein the resistive element comprises a MOS transistor of the first conductivity type, whose first end is connected to the first voltage line, whose second end is connected to the first end of the first MOS transistor, whose gate is applied to a direct-current voltage, and
the voltage potential difference between the direct-current voltage and the voltage of the first voltage line is constant.

12. The CMOS logic circuit according to claim 11, wherein the MOS transistor of the first conductivity type included in the resistive element is a pMOS transistor.

13. The CMOS logic circuit according to claim 1, wherein the resistive element comprises a depression-type MOS transistor of the second conductivity type that is connected to the first voltage line at a first end thereof and is connected to the first end of the first MOS transistor at a second end and a gate thereof.

14. The CMOS logic circuit according to claim 13, wherein the depression-type MOS transistor of the second conductivity type included in the resistive element is a depression-type nMOS transistor.

15. The CMOS logic circuit according to claim 1, wherein the resistive element comprises a depression-type MOS transistor of the first conductivity type that is connected to the first voltage line at a first end and a gate thereof and is connected to the first end of the first MOS transistor at a second end thereof.

16. The CMOS logic circuit according to claim 15, wherein the depression-type MOS transistor of the first conductivity type included in the resistive element is a depression-type pMOS transistor.

17. The CMOS logic circuit according to claim 1, wherein the resistive element comprises a diode that is forward-biased between the first voltage line and the first end of the first MOS transistor.

18. The CMOS logic circuit according to claim 17, wherein the diode is a MOS transistor whose drain and gate are shorted.

19. The CMOS logic circuit according to claim 1, wherein a first end of the fifth MOS transistor is connected to the first end of the resistive element, and a second end of the fifth MOS transistor is connected to the second end of the resistive element.

20. The CMOS logic circuit according to claim 1, wherein a first end of the fifth MOS transistor is connected to the first end of the resistive element, and a second end of the fifth MOS transistor is connected to the first end of the first MOS transistor.

* * * * *